United States Patent [19]

DeAntonis et al.

[11] Patent Number: 4,677,017

[45] Date of Patent: Jun. 30, 1987

[54] COEXTRUSION OF THERMOPLASTIC FLUOROPOLYMERS WITH THERMOPLASTIC POLYMERS

[75] Inventors: Ferdinand A. DeAntonis, Fogelsville; William H. Murrell, Orwigsburg, both of Pa.

[73] Assignee: Ausimont, U.S.A., Inc., Morristown, N.J.

[21] Appl. No.: 827,487

[22] Filed: Feb. 6, 1986

Related U.S. Application Data

[63] Continuation of Ser. No. 518,984, Aug. 1, 1983, abandoned.

[51] Int. Cl.[4] .................... B32B 7/02; B32B 27/08; C09J 7/02
[52] U.S. Cl. .................... 428/214; 156/244.11; 428/215; 428/349; 428/354; 428/355; 428/412; 428/421; 428/422; 428/476.3; 428/476.9; 428/515; 428/516; 428/517; 428/520; 428/913
[58] Field of Search .......... 428/421, 422, 349, 476.3, 428/355, 913, 412, 354, 476.9, 516, 517, 520, 515, 215, 214; 156/244.11; 426/127

[56] References Cited

U.S. PATENT DOCUMENTS 3,549,389 12/1970 Peterson ................ 426/127
3,595,740 7/1971 Gerow ................... 428/349
4,233,367 11/1980 Ticknor et al. ......... 428/476.3
4,254,169 3/1981 Schroeder ............. 428/516 X
4,407,887 10/1983 Hashizume et al. ..... 428/421 X
4,444,826 4/1984 Sasaki et al. ......... 428/421 X

FOREIGN PATENT DOCUMENTS 0079178 5/1983 European Pat. Off. ...... 428/355

OTHER PUBLICATIONS

L. M. Shlanger et al., Modern Plastics Encyclopedia, 1985-1986, pp. 23-25.

Primary Examiner—Thomas J. Herbert
Attorney, Agent, or Firm—John G. Gilfillan; Elliot M. Olstein; Raymond J. Lillie

[57] ABSTRACT

The present invention is a multilayered coextruded film and process of coextruding. The coextruded film comprises at least one thermoplastic fluoropolymer layer and at least one thermoplastic polymeric layer adjacent to the thermoplastic fluoropolymer layer. There is preferably a coextruded adhesive layer between each thermoplastic fluoropolymer layer and each thermoplastic polymeric layer. The coextruded film can be oriented in at least one direction and/or embossed without delamination, fibrillating, or splitting.

28 Claims, No Drawings

COEXTRUSION OF THERMOPLASTIC FLUOROPOLYMERS WITH THERMOPLASTIC POLYMERS

This application is a continuation of application Ser. No. 518,984 filed Aug. 1, 1983 now abandoned.

BACKGROUND OF THE INVENTION

The present invention is in the field of thermoplastic coextrusions; more particularly, the invention relates to coextrusions of thermoplastic fluoropolymers with thermoplastic polymers.

It is generally known how to coextrude film and sheet as indicated in the Modern Plastics Encyclopedia, Vol. 56, No. 10A, pp. 131-132, McGraw Hill, October, 1979. Coextruded sheet and film, are made using multimanifold dies such as a multimanifold cicular die for blown film or a coextrusion feedblock for flat cast film and sheet. The article "Trends & equipment . . . Coextrusion" by M. H. Naitove in Plastics Technology, February, 1977, pp 61-71, discussed coextrusion in further detail. For the purposes of this invention the term film includes both film and sheet unless otherwise indicated.

A variety of different thermoplastics have been coextruded to form multilayered coextruded film to take advantage of different properties in different layers. Typical multilayered coextruded film include different thermoplastic polymeric layers having specific characteristics desired in coextruded film. Coextruded films could include a layer of polyethylene or polypropylene to provide a moisture barrier. The coextruded film can incorporate a layer of ionomer or nylon to improve toughness, or a layer of nylon as an oxygen barrier. A layer of polyvinylidene chloride can be included as an oxygen and moisture barrier. A layer of ethylene vinyl acetate copolymer or an ionomer can be included to provide heat sealability to a multilayer coextruded film.

Thermoplastic fluoropolymers can be extruded or solution cast to form films. These materials offer excellent chemical resistance and barrier properties. However, fluoropolymers have not been coextruded to form multilayered film structures. This could be due to difficulty in adhering fluoropolymer film layers to other thermoplastic layers.

SUMMARY OF THE INVENTION

The present invention is a multilayered coextruded film and process of coextruding. The coextruded film comprises at least one thermoplastic fluoropolymer layer and at least one thermoplastic polymeric layer adjacent to the thermoplastic fluoropolymer layer. There is preferably a coextruded adhesive layer between each thermoplastic fluoropolymer layer and each thermoplastic polymeric layer. The coextruded film can be oriented in at least one direction and/or embossed without delamination, fibrillating, or splitting.

The present invention also includes a process of coextruding a multilayered film. The process comprises the steps of coextruding at least one thermoplastic fluoropolymer layer adjacent to at least one thermoplastic polymeric layer. An adhesive layer is preferably coextruded between each thermoplastic fluoropolymer layer and each thermoplastic polymeric layer. The process can optionally include the steps of orienting and/or embossing the coextruded film.

DESCRIPTION OF THE PREFERRED EMBODIMENTS

The present invention is a multilayered coextruded film and process to coextrude a multilayered film. Briefly, the coextruded film has at least one thermoplastic fluoropolymer layer and at least one thermoplastic polymeric layer adjacent to the thermoplastic fluoropolymer layer. There is preferably an adhesive between each thermoplastic fluoropolymer layer and each thermoplastic polymeric layer. The adhesive layer preferably comprises at least one modified polyolefin. The preferred modified polyolefins are modified ethylene vinyl acetate copolymers. The coextruded film can be oriented in at least one direction and/or embossed.

For the purposes of the present invention coextruded film includes sheets as well as films unless otherwise indicated. The coextrusion is particularly useful as multilayered coextruded film as opposed to thicker sheets. Very thin fluoropolymer layers can be coextruded with thermoplastic polymeric layers to form the multilayered coextruded film of the present invention. A thin layer of the thermoplastic fluoropolymer is often all that is needed to take advantage of the excellent chemical resistance of thermoplastic fluoropolymers while at the same time minimizing the amount of thermoplastic fluoropolymer in the multilayered coextruded film. This is particularly advantageous considering the cost of thermoplastic fluoropolymers in comparison to the general variety of thermoplastic film forming polymer materials available.

The thickness of each layer in the coextruded film is at least 0.05 mils. Each layer can range from 0.05 mils to layers as thick as 250 mils. Film can have layers which are preferably from 0.1 to 25 mils thick, while sheets can have thicker layers as well as thin layers. The preferred thickness range of the film is from 0.1 mil to 25 mils, preferably 0.5 to 10 mils. The thickness of the adhesive layer is greater than 0.05 mils, and preferably ranges from 0.05 to 0.5 mils, and more preferably 0.1 to 0.3 mils. The multilayer films of the present invention are particularly useful where layer thicknesses are between 0.05 to about 0.5 and preferably 0.05 to 0.1 mils. Layers in this range cannot readily be made by other methods to form multilayered films.

The structure of the coextruded film of the present invention can vary. A thermoplastic fluoropolymer layer in the extruded film can vary from 1 to 99% of the thickness of the total structure. Alternately, the thermoplastic polymeric layer can vary from 1 to 99% of the thickness of the total structure. There should be a sufficient amount of the adhesive to prevent delamination.

The multilayered coextruded film of the present invention can have a variety of structures so long as there is an adhesive layer between each thermoplastic fluoropolymer layer and each thermoplastic polymeric layer. A typical film structure includes a thermoplastic polymeric layer, an adhesive layer and a thermoplastic fluoropolymer layer. Another structure envisioned includes a layer of thermoplastic fluoropolymer, an adhesive layer, a thermoplastic polymeric layer, an adhesive layer, and another thermoplastic fluoropolymer layer. Any variation of the order of the layers of the thermoplastic fluoropolymer and thermoplastic polymeric layer can be made. The number of layers in the multilayered coextruded film is only limited by the equipment.

The multilayer coextruded film of the present invetnion can be coextruded using coextrusion equipment generally known in the art. This includes coextrusion using a feed block with a standard die, a multimanifold circular die for blown bubble film, and multimanifold die for flat cast film and sheet. A coextrusion feedblock and flat die can be used for cast film. Useful equipment is described in the article by Naitove referenced in the Background of the Invention and hereby incorporated by reference. The coextrusion process has advantages over other processes to from multilayered films. These advantages include the combination of molten layers in one step. Coextrusion allows a broad range of layer thicknesses including very thin ranges.

Thermoplastic fluoropolymers useful in the present invention are film-forming thermoplastic fluoropolymers. The thermoplastic fluoropolymers include, but are not limited to, ethylene chlorotrifluoroethylene copolymer, polychlorotrifluoroethylene, ethylene tetrafluoroethylene copolymer, fluorinated ethylene-propylene copolymer (FEP), and polyvinylidene fluoride. Particularly preferred is ethylene chlorotrifluoroethylene copolymer.

Useful thermoplastic polymers include film-forming thermoplastic polymers. Such polymers include, but are not limited to, polyamides, polyolefins including polyethylene and polypropylene, polyolefin copolymers, ionomers such as neutralized olefin-carboxylic acid copolymers, polystyrene, polycarbonates, acrylic polymers and copolymers, and fluoropolymers.

Preferred polyamides include polyepsilon-caprolactam and polyhexamethyleneadipamide. Other useful polyamides include film-forming polyamides made from the polymerization of lactam monomers, and the copolymerization of diamines and dicarboxylic acids.

Polyolefins include low density polyethylenes, high density polyethylenes and polypropylenes. The polyolefin copolymers include the copolymers of ethylene and vinyl acetate, the copolymers of ethylene and vinyl alcohol, the copolymers of ethylene and acrylic acid, the copolymers of ethylene and methylacrylate, and the copolymers of ethylene and ethylacrylate. Ionomers include the copolymers of polyolefins and alpha,betaethylenically unsaturated carboxylic acids neturalized with metal salts. Ionomers include Surlyn ® ionomers such as the copolymers of ethylene and methacrylic acid, with the carboxyl groups neutralized by metals including sodium and zinc.

The adhesive layer can be made of an extrudable adhesive which is compatible for extrusion with the adjacent polymer layers. Preferably, the adhesive layer is made of a modified polyolefin copolymer such as ethylene vinyl acetate copolymer, or a blend of modified polyolefins and another copolymer such as an olefin and ester copolymer. A modified polyolefin is one that has reactive groups, such as carboxylic acid groups incorporated into the polyolefin chain. Modified polyolefins also can include carboxylic acid containing materials blended with the polyolefin. The most preferred modified polyolefin is the modified copolymer of ethylene and vinyl acetate. This copolymer is modified to contain carboxylic acid groups. This copolymer has been found to be particularly useful to form coextruded laminates of thermoplastic fluoropolymers and polyamides.

Preferred adhesives are CXA type resins sold by the Du Pont Company. These resins have been indicated to be useful for coextrusion of a variety of polymeric materials not including fluoropolymers. These resins have been found to be useful in the process of the present invention to make the multilayered coextruded film of the present invention. CXA 3101, CXA 1124, and CXA 1123 are particularly preferred. A detailed description of these CXA resins is found in the following bulletins hereby incorporated by reference: "Du Pont CXA, Coextrudable Adhesive Resins For Multilayer Packaging Structures" by Philip S. Blatz; "Du Pont CXA 3101, Coextrudable Adhesive Resin For Flexible Packaging"; and "Du Pont CXA 1123 & 1124". ELVAX ® EVA 3135X Ethylene Vinyl Acetate Copolymer Resin For Flexible Packaging describes a resin useful to vary the viscosity of the resin selected for use as the adhesive layer. Resins such as CXA 3101 and CXA 1124 have been found to be satisfactory for coextrusion to form films having layers of fluoropolymers at temperatures above the recommended adhesive processing temperature limit of 230° C. to 240° C. (446° F. to 464° F.).

The adhesive layre can be a blend of at least two modified polyolefins. Preferred modified polyolefins are modified ethylene vinyl acetate copolymers, which are modified to have acid groups in addition to ester groups. A preferred blend comprises a first modified ethylene vinyl acetate copolymer having a melt index of about 0.1 to 10 grams per 10 minutes, and a second modified ethylene vinyl acetate copolymer having a melt index of from 5 and preferably 10 to 200 grams per 10 minutes. For the purposes of the present invention, melt index is measured according to ASTM Test No. D-1238. The blend of the first and second polyolefin should comprise from 25 to 99%, preferably 50 to 95% and more preferably 75 to 95% of the first polyolefin based on the blend of the first polyolefin and the second polyolefin. Correspondingly there is 1 to 75%, preferably 5 to 50% and more preferably 5 to 25% of the second polyolefin.

The most preferred modified ethylene vinyl acetate copolymer for use as the first polymer is CXA-3101 produced by Du Pont and has a melt index of 3.5 (ASTM D-1238), a density of 0.948 grams per cubic centimeter (ASTM D-792), and the softening point of 131° F. (ASTM D-1525). The most preferred second modified ethylene vinyl acetate copolymer in an adhesive blend is CXA-1124 produced by Du Pont and has a melt index of 25 grams per 10 minutes, a density of 0.950 grams per cubic centimeter (ASTM D-792), and a softening point of 101° F. (ASTM D-1525). The most preferred adhesive composition is a blend of 90% by weight CXA-3101 and 10% by weight CXA-1124.

Other useful adhesives include modified and unmodified ethylene methylacrylate copolymer and adhesives disclosed in U.S. Pat. Nos. 4,058,647 and 4,254,169 hereby incorporated by reference.

The multilayer coextruded film of the present invention includes a coextrusion of the fluoropolymer and an adhesive layer adjacent to at least one side of the fluoropolymer layer.

In order to successfully coextrude the multilayered film of the present invention, the thermoplastic fluoropolymer layer, the adhesive layer, and the thermoplastic layer must be made of polymeric materials which are compatible in the coextrusion process. Compatibility can be indicated by melt properties which are similar as to allow coextrusion. Melt properties of interest include melting points, melt indexes, apparent viscosity and melt stability. Non-compatibility of polymers in the coextrusion can result in the inability to form the film where adjacent layers have good adhesion and uniform thickness across the film width. Non-compatible polymers can result in streaky, mottled film. Typically, non-compatible extrudable polymers designed to form a clear multilayer film result in a mottled, cloudy film or poor polymer distribution. The compatibility of the various polymers from the above lists for use in the film laminates of the present invention can be determined by considering the above indicators of compatibility. Once the polymers having the desired properties are selected, experimental trials can be conducted to determine the optimum combination of relative properties in adjacent layers.

The polymers to be coextruded must not only be compatible, but they must be compatible within a relatively close temperature range so that they can be coextruded through a common die. It has been found that a limitation with modified ethylene vinyl acetate copolymer adhesives is their temperature stability. The highest temperature at which the materials (such as CXA 3101) can be extruded is between about 450° F. and 470° F. Generally, for fluoropolymers such as ethylene chlorotrifluoroethylene, the lowest processing temperatures is higher than the adhesive temperature range. A preferred set of processing melt temperatures for ethylene chlorotrifluoroethylene copolymer is 500° F. to 530° F. Preferred processing melt temperature for polymers to be coextruded to the ethylene chlorotrifluoroethylene is 450° F. to 520° F. For polyepsiloncaprolactam the lowest preferred range is 470° F. to 520° F. and for ethylene vinyl alcohol copolymer the preferred range is 450° F. to 470° F. The melt temperature can be adjusted within the limits to vary the melt viscosity to improve coextrusion compatibility.

The coextruded multilayer film of the present invention can be oriented and/or embossed. The multilayer film can be oriented without delaminating or fibrillating. The embossing and or orientation of the film can be conducted by methods known in the art. A typical process and range of conditions for monoaxially orienting a fluoropolymer and polyamide film laminate are similar to those disclosed for polyamides in U.S. Pat. No. 4,362,585, hereby incorporated by reference. Alternately, the film laminate of the present invention can be biaxially oriented using a blown tube apparatus, or a tenter frame apparatus.

The film can be monoaxially drawn or biaxially drawn as required and considering the draw limitation of the polymers in the various layers. Typically, film can be monoaxially drawn to a draw ratio of from 1.5:1 to 10:1 and preferably from 1.5:1 to 6:1. Typically, film can be biaxially drawn to a draw ratio of from 1.5:1 to 10:1 and preferably 1.5:1 to 6:1 in the machine direction and from 1.5:1 to 10:1 and preferably 1.5:1 to 6:1 in the transverse direction. Draw ratio is an indication of the increase in the dimension in the direction of draw.

The film laminate of the present invention can be embossed by means known in the art if it is nonoriented or oriented. Typically, embossing can be accomplished using film embossing rolls.

It has been found that the multilayered coextruded film of the present invention does not delaminate whether or not it is oriented and/or embossed. Further upon orientation the multilayer film does not fibrilate.

The fluoropolymer layers of the coextruded films of the present invention have chemical inertness and allow the film to be used as cable wrap, in drug packaging applications, and as carrier films in process such as in framing copper clad laminates of electronic uses.

Several examples are set forth below to illustrate the nature of the invention and the manner of carrying it out. However, the invention should be considered as being limited to the details thereof. All parts are by weight or otherwise indicated.

EXAMPLES 1

A thermoplastic layer of polyepsiloncaprolactam having specific gravity of 1.13 (ASTM D-792) and a melting point of 420° F. (250° C.) was cast coextruded with an equimolar ethylene chlorotrifluoroethylene copolymer (ECTFE) having a specific gravity of 1.68. The polyepsiloncaprolactam is sold by Allied Corporation as Capron ® 8207F nylon (nylon 6). The relative formic acid viscosity was 73 measured in 90 percent formic acid at a concentration of 9.2 percent by weight. The ethylene chlorotrifluoroethylene (ECTFE) copolymer is sold by Allied Corporation as HALAR ® 500. The ECTFE copolymer had a density of 1.68 gm/ml, and a melt index of 15 g/10 minutes as measured according to ASTM 1238 run at 275° F. under a piston load of 2160 grams, and about 49 to 51 mol percent ethylene and a corresponding amount of chlorotrifluoroethylene monomer. The adhesive utilized was a blend of modified ethylene vinyl acetate copolymers. The blend comprised 10% of CXA-1124 and 90% of CXA-3101, both sold by the Du Pont Co.

The polyepsiloncaprolactam was extruded through a 2½ inch diameter Davis Standard Extruder having the temperature profile of Zone 1-410° F., Zone 2-450° F., Zone 3-520° F., Zone 4-490° F., Zone 5-490° F., and adaptor Zone 1-490° F. The extruder was operated at a screw speed of 35 RPM with a barrel pressure of 1000 psig. The motor drive load was 36 amps. The melt temperature 505° F.

The ethylene chlorotrifluoroethylene copolymer was extruded through a 1¾ inch (nominal) diameter Reifenhauser extruder. The extruder had a temperature profile which included Zone 1-450° F., Zone 2-520° F., Zone 3-540° F., Zone 4-525° F., and the adaptor Zone at 490° F. This extruder was operated at a screw speed of 29 RPM with a barrel pressure of 650 psig. The motor drive load was 8.5 amps. The melt temperature was 522° F.

The adhesive blend was extruded through a 1½ inch diameter Davis Standard Extruder. The temperature profile of this extruder was Zone 1-280° F., Zone 2-450° F., and adaptor Zone 1 at 443° F. This extruder had a screw speed of 20 RPM, a barrel pressure of 650 psig. The melt temperature was 435° F. The motor drive load was 2.5 amps.

The extrudate from the three extruders was passed through a coextrusion feedblock manufactured by the Johnson Plastic Corporation and operating at an adaptor temperature at Zone 1-478° F. and Zone 2-481° F. The laminate from the coextrusion adaptor went to a die having three zones operating at about 505° F.

The coextruded film was then cast on a roll at 180° F., followed by a cooling roll at 145° F., and an additional roll at 175° F.

The film made had a total thickness of 2.30 mils with the following layers: 1.36 mils of polyepsiloncaprolactam (nylon 6), 0.39 mils of adhesive blend, 1.55 mils of ethylene chlorotrifluoroethylene copolymer (ECTFE). The adhesion between the layers of ECTFE copolymer and nylon was tested according to ASTM Test No.

ASTM F88. The adhesion and value was 775 g/in. The multilayer film was clear, had a uniform appearance, and uniform polymer distribution in each layer.

EXAMPLE 2

A five layer laminate was coextruded using the ECTFE copolymers and nylon 6 of Example 1. The adhesive utilized was a modified ethylene vinyl acetate copolymer, CXA-3101.

The polyepsiloncaprolactam was extruded through the Davis Standard Extruder having the temperature profile of Zone 1-410° F., Zone 2-450° F., Zone 3-500° F., Zone 4-490° F., Zone 5-490° F., and adaptor Zone 1-490° F. The extruder was operated at a screw speed of 16 RPM with a barrel pressure of 1000 psig and a motor drive load amperage of 45 amps. The melt temperature was 458° F.

The ethylene chlorotrifluoroethylene copolymer was extruded through a 1¾ inch (nominal) diameter Reifenhauser extruder. The extruder had a temperature profile which included Zone 1-450° F., Zone 2-530° F., Zone 3-545° F., Zone 4-550° F., and the adaptor Zone at 500' F. This extruder was operated at a screw speed of 40 RPM with a barrel pressure of 670 psig and a motor drive load amperage of 115 amps. The melt temperature was 504° F.

The adhesive was extruded through a 1½ inch diameter Davis Standard Extruder. The temperature profile in this extruder was Zone 1-250° F., Zone 2-475° F., and adaptor Zone 1 at 460° F. This extruder and a screw speed of 62 RPM and motor drive load of 2.8 amps. The melt temperature was 396° F.

The extrudate from the three extruders was passed through a coextrusion feedblock and manufactured by the Johnson Plastic Corporation and operating at an adaptor temperature at Zone 1-480° and Zone 2-481°. The laminate from the coextrusion adaptor went to a die having three Zones operating at Zone 1-509° F., Zone 2-506° F., and Zone 3-506° F.

The coextruded film was then cast on a roll at 175° F., followed by a cooling roll at 190° F., and an additional roll at 230° F.

The film had a total thickness of 1.0 mils with the following layers: 0.1 mil ECTFE copolymer/0.08 mil CXA 3101/0.64 mil nylon 6/0.8 mil CXA 3101/0.1 mil ECTFE copolymer. The adhesion between the layers and ECTFE copolymer and nylon was tested as in Example 1. The ECTFE layer, which was only 0.1 mils, broke before delamination occurred. The multilayer film was clear, had a uniform appearance, and a uniform polymer distribution in each layer.

EXAMPLE 3

A five layer film was coextruded having layers of ethylene vinyl alcohol copolymer and ECTFE copolymer of the type described in Example 1. The adhesive was the same type as described in Example 2.

A thermoplastic layer of ethylene vinyl alcohol copolymer produced by Kuraray of Japan (Grade EP-F) was cast coextruded with layers of equimolar ethylene chlorotrifluoroethylene copolymer. The ethylene vinyl alcohol copolymer had a melt index of 1.6 grams per 10 minutes as measured on the ASTM D-1238 test at a load of 2160 grams at 190° C. The ethylene vinyl alcohol resin contained about 60 mole percent vinyl alcohol and had a glass transition temperature of 69° C.

The ethylene vinyl alcohol was extruded through a 2½ inch diameter Davis Standard Extruder having the temperature profile of Zone 1-290° F., Zone 2-380° F., Zone 3-440° F., Zone 4-440° F., Zone 5-410° F., and adaptor Zone 1-475° F. The extruder was operated at a screw speed of 19 RPM with a barrel pressure of 500 psig and a motor drive load of 38 amps. The melt temperature was 407° F.

The ethylene chlorotrifluoroethylene copolymer was extruded through a 1¾ inch (nominal) diameter Reitenhauser extruder. The extruder had a temperature profile which included Zone 1-450° F., Zone 2-530° F., Zone 3-545° F., Zone 4-550° F., and the adaptor Zone at 500° F. The motor drive load was 11 amps. This extruder was operated at a screw speed of 42 RPM with a barrel pressure of 700 psig. The melt temperature was 510° F.

The adhesive was extruded through a 1½ inch diameter Davis Standard Extruder. The temperature profile in this extruder was Zone 1-250° F., Zone 2-475° F., and adaptor Zone 1 at 460° F. This extruder had a screw speed of 20 RPM, and a motor drive amperage of 2.6 amps. The melt temperature was 435° F.

The extrudate from the three extruders was passed through a coextrusion feedblock coextruder adaptor manufactured by the Johnson Plastic Corporation and operating at an adaptor temperature at Zone 1-480° F. and Zone 2-481° F. The laminate from the coextrusion adaptor went to a die having three Zones operating at Zone 1-509° F., Zone 2-506° F., Zone 3-506° F.

The coextruded film was then cast on a roll at 175° F., followed by a cooling roll at 185° F., and an additional roll at 230° F.

The film had a total thickness of 1.0 mils with the following layers: 0.1 mil ECTFE copolymer/0.08 mil CXA 3101/0.64 mils ethylene vinyl alcohol copolymer/0.08 mil CXA 3101/01. mil ECTFE copolymer. The adhesion between the layers of ECTFE copolymer and ethylene vinyl alcohol copolymer was tested as in Example 1. The ECTFE layer, which was only 0.1 mil thick broke before delamination occurred. The multilayer film was clear, had a uniform appearance, and a unifrom polymer distribution in each layer.

EXAMPLE 4

A thermoplastic oriented coextruded multilayered film of polyepsiloncaprolactam and an equimolar ethylene chlorotrifluoroethylene copolymer of the type used in Example 1 was made. The adhesive utilized was a CXA 3101 modified ethylene vinyl acetate copolymer as described above.

The polyepsiloncaprolactam was extruded through a 2½ inch diameter Davis Standard Extruder having the temperature profile of Zone 1-410° F., Zone 2-450° F., Zone 3-520° F., Zone 4-500° F., Zone 5-490° F., and adaptor Zone 1-496° F. The extruder was operated at a screw speed of 30 RPM with a barrel pressure of 1100 psig and a motor drive amperage of 41 amps. The melt temperature was 486° F.

The ethylene chlorotrifluoroethylene copolymer was extruded through a 1¾ inch (nominal) diameter Reifenhauser extruder. The extruder had a temperature profile which included Zone 1-440° F., Zone 2-485° F., Zone 3-535° F., Zone 4-525° F., and the adaptor Zone at 500° F. This extruder was operated at a screw speed of 33 RPM; the motor drive amperage was 10 amps. The melt temperature was 518° F.

The adhesive was extruded through a 1½ inch diameter Davis Standard Extruder. The temperature profile in this extruder was Zone 1-280° F., Zone 2-450° F., and adaptor Zone 1 at 437° F. This extruder had a screw speed of 33 RPM. The motor drive load was 2.6 amps. The melt temperature was 429° F.

The extrudate from the three extruders was passed through a coextrusion feedback manufactured by the Johnson Plastic Corporation which was operated at an adaptor temperature at Zone 1-485° and Zone 2-485°. The laminate from the coextrusion feedblock went to a die having three Zones operating at Zone 1-508° F., Zone 2-507° F. and Zone 2-503° F.

The coextruded film was then cast on a roll at 180° F., followed by a cooling roll at 145° F., and an additional roll at 170° F.

The film was oriented monoaxially. It traveled over a preheated roll at 240° F., to a slow stretch roll at 235° F., to a fast stretch roll at 235° F., to a heat set roll at 250° F., and finally to a cooling roll at 200° F. The draw ratio was 3.2:1. A detailed description of the orientation process is discussed in U.S. Pat. No. 4,362,585.

The final structure of the film laminate was 0.22 mils ECTFE copolymer/0.12 mil CXA 3101 copolymer/0.66 mils nylon 6. The adhesion between the layers of ECTFE copolymer and nylon was tested as in Example 1 after orientation. The adhesion value was 650 g/in. The oriented multilayer film was clear, had a uniform appearance and uniform polymer distribution in each layer.

While exemplary embodiments of the invention have been described, the true scope of the invention is to be determined from the following claims.

What is claimed is:

1. A multilayered coextruded film comprising at least one thermoplastic fluoropolymer layer wherein the thermoplastic fluoropolymer is selected from the class consisting of ethylene/chlorotrifluoroethylene copolymer ethylene/tetrafluoroethylene copolymer and fluorinated ethylene-propylene copolymer, and at least one thermoplastic polymer layer made from a coextrusion compatible thermoplastic selected from the class consisting of polyamide, and ethylene vinyl alcohol copolymer layer, and an adhesive selected from the group consisting of ethylene vinyl acetate copolymer, olefin and ester copolymers, copolymers of polyolefins and carboxylic acid containing groups, and mixtures thereof, between the thermoplastic polymeric layer and the thermoplastic fluoropolymer layer wherein each layer is from 0.05 to 250 mils thick and wherein the fluoropolymer was coextruded at a temperature from 500° F. to 530° F. and the thermoplastic polymer was coextruded at a temperature from 450° F. to 520° F.

2. The film as recited in claim 1 wherein the film is embossed.

3. The film as recited in claim 1 wherein the film is embossed.

4. The film as recited in claim 1 wherein the thermoplastic polymeric layer is made from a polyamide.

5. The film as recited in claim 1 wherein the thermoplastic polymeric layer is made from ethylene vinyl alcohol copolymer.

6. The film as recited in claim 1 wherein the adhesive layer comprises a mixture of at least one modified polyolefin.

7. The film as recited in claim 6 wherein there are at least two modified polyolefins which are modified ethylene vinyl acetate copolymers.

8. The film as recited in claim 1 wherein the film is oriented in at least one direction.

9. The film as recited in claim 8 wherein the film is monoaxially oriented.

10. The film as recited in claim 8 wherein the film is biaxially oriented.

11. A multilayered coextruded film comprising at least one thermoplastic fluoropolymer layer wherein the thermoplastic fluoropolymer is selected from the class consisting of ethylene chlorotrifluoroethylene copolymer, ethylene tetrafluoroethylene copolymer and fluorinated ethylene-propylene copolymer, and at least one coextrusion compatible thermoplastic polymer, and an adhesive selected from the group consisting of ethylene vinyl acetate copolymer, olefin and ester copolymers, copolymers of polyolefins and carboxylic acid containing groups, and mixtures thereof, between the thermoplastic fluoropolymer layer and the thermoplastic polymeric layer, wherein each layer is from 0.05 to 250 mils thick and wherein the fluoropolymer is coextruded at a temperature from 500° F. to 530° F. and the thermosplastic polymer is coextruded at a temperature from 450° F. to 520° F.

12. The film as recited in claim 11 wherein the thermoplastic polymeric layer is made from a thermoplastic selected from the class consisting of polyamide, polyethylene, polypropylene, polyolefin copolymers, ionomers, polystyrenes, polycarbonates, acrylic polymers and copolymers, and fluoropolymers.

13. The film as recited in claim 12 wherein there is a first modified ethylene vinyl acetate copolymer having a melt index of from about 0.1 to 10 g/10 minutes and the second modified ethylene vinyl acetate copolymer having a melt index from 5 to 1200 g/10 minutes, the second modified ethylene vinyl acetate.

14. The multilayer coextruded film of claim 11 wherein the thermoplastic fluoropolymer layer is selected from the class consisting of ethylene tetrafluoroethylene copolymer and ethylene chlorotrifluoroethylene copolymer and the thermoplastic polymer is selected from the class of polyamides and polyolefins.

15. The multilayered coextruded film as recited in claim 14 wherein the polyamide is polyepsiloncaprolactam and the polyolefin is ethylene vinyl alcohol copolymer.

16. A process of coextruding a multilayer film comprising the steps of coextruding at least one thermoplastic fluoropolymer layer wherein the thermoplastic fluoropolymer is selected from the class consisting of ethylene/chlorotrifluoroethylene copolymer, ethylene/tetrafluoroethylene copolymer, and fluorinated ethylene-propylene copolymer, and at least one coextrusion compatible thermoplastic polymeric layer, wherein the thermoplastic polymeric layer is made from a thermoplastic selected from the class consisting of polyamide and ethylene vinyl alcohol copolymer layer, and an adhesive selected from the group consisting of ethylene vinyl acetate copolymer, olefin and ester copolymers, copolymers of polyolefins and carboxylic acid containing groups, and mixtures thereof between the thermoplastic fluoropolymer layer and the thermoplastic polymeric layer, wherein each layer is from 0.05 to 250 mils thick, and wherein the fluoropolymer is coextruded at a temperature from 500° F. to 530° F. and the thermoplastic polymer is coextruded at a temperature from 450° F. to 520° F.

17. The process as recited in claim 16 further comprising the step of embossing the film.

18. The process as recited in claim 16 wherein the thermoplastic polymeric layer is made from a polyamide.

19. The process as recited in claim 16 wherein the thermoplastic polymeric layer is made from ethylene vinyl alcohol copolymers.

20. The process as recited in claim 16 further comprising the step of orienting the film in at least one direction.

21. The process as recited in claim 10 further comprising the step of embossing the oriented film laminate.

22. The process as recited in claim 20 wherein the film is monoaxially oriented.

23. The process as recited in claim 21 wherein the film laminate is biaxially oriented.

24. A process of coextruding a multilayered film comprising the steps of coextruding at least one fluoropolymer layer wherein the fluoropolymer is selected from the class consisting of polychlorotrifluoroethylene, ethylene chlorotrifluoroethylene copolymer, ethylene tetrafluoroethylene copolymer, and fluorinated ethylene-propylene copolymer and at least one coextrusion compatible thermoplastic polymeric layer, and an adhesive selected from the group consisting of ethylene vinyl acetate copolymer, olefin and ester copolymers, copolymers of polyolefins and carboxylic acid containing groups, and mixtures thereof, between the thermoplastic fluoropolymer layer and the thermoplastic polymeric layer, and wherein each layer is from 0.05 to 250 mils thick, and wherein the fluoropolymer is coextruded at a temperature from 500° F. to 530° F. and the thermoplastic polymer is coextruded at a temperature from 450° F. to 520° F.

25. The process of claim 24 wherein the thermoplastic polymer is polyepsiloncaprolactam, the fluoropolymer is ethylene chlorotrifluoroethylene and the adhesive is a modified ethylene vinyl acetate copolymer, and the process further comprises coextruding the ethylene chlorotrifluoroethylene copolymer at a temperature range of 500° F. to 530° F. coextruding the polyepsiloncaprolactam at a temperature range of 470° F. to 520° F., and coextruding the adhesive layer at from 450° F. to 470° F.

26. The process of claim 24 wherein the thermoplastic polymer is ethylene vinyl alcohol the fluoropolymer is ethylene chlorotrifluoroethylene and the adhesive is a modified ethylene vinyl acetate copolymer, and the process further comprises coextruding the ethylene chlorotrifluoroethylene copolymer at a temperature range of 500° F. to 530° F. coextruding the ethylene vinyl alcohol at a temperature range of 450° F. to 470° F., and coextruding the adhesive layer at from 450° F. to 470° F.

27. The process recited in claim 24 wherein the fluoropolymer is ethylene chlorotrifluoroethylene copolymer.

28. The process of claim 27 further comprising coextruding an adhesive layer at a temperature less than 470° F. between the thermoplastic fluoropolymer and the thermoplastic polymer.

* * * * *